(12) United States Patent
Shibasaki et al.

(10) Patent No.: US 10,770,902 B2
(45) Date of Patent: Sep. 8, 2020

(54) SOLAR CELL SYSTEM AND METHOD FOR CONTROLLING SOLAR CELL SYSTEM

(71) Applicant: KABUSHIKI KAISHA TOSHIBA, Minato-ku, Tokyo (JP)

(72) Inventors: Soichiro Shibasaki, Nerima Tokyo (JP); Mutsuki Yamazaki, Yokohama Kanagawa (JP); Sara Yoshio, Taito Tokyo (JP); Naoyuki Nakagawa, Setagaya Tokyo (JP); Kazushige Yamamoto, Yokohama Kanagawa (JP); Yuya Honishi, Yokohama Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 87 days.

(21) Appl. No.: 15/911,316

(22) Filed: Mar. 5, 2018

(65) Prior Publication Data
US 2019/0089162 A1    Mar. 21, 2019

(30) Foreign Application Priority Data
Sep. 19, 2017 (JP) .................................. 2017-178757

(51) Int. Cl.
*H02S 40/36* (2014.01)
*H02S 30/10* (2014.01)
(Continued)

(52) U.S. Cl.
CPC ............ *H02J 3/383* (2013.01); *H01L 31/028* (2013.01); *H01L 31/02008* (2013.01);
(Continued)

(58) Field of Classification Search
CPC .. H02J 3/383; H01L 31/0687; H01L 31/0322; H01L 31/028; H01L 31/02008; H01L 31/0504; H02S 40/30
See application file for complete search history.

(56) References Cited

U.S. PATENT DOCUMENTS 7,605,498 B2    10/2009   Ledenev et al.
9,413,289 B2 *   8/2016   Ito ........................... H02S 40/32
(Continued)

FOREIGN PATENT DOCUMENTS

JP        06-163965       6/1994
JP        2003-333757     11/2003
(Continued)

*Primary Examiner* — Alfonso Perez Borroto
*Assistant Examiner* — Esayas G Yeshaw
(74) *Attorney, Agent, or Firm* — Amin, Turocy & Watson, LLP

(57) ABSTRACT

According to one embodiment, a solar cell system includes a first solar cell including a first terminal and a second terminal, a second solar cell including a third terminal and a fourth terminal, and a voltage converter including a fifth terminal and a sixth terminal. The third terminal is electrically connected to the first terminal. The fifth terminal is electrically connected to the fourth terminal. The voltage converter causes a second absolute value to be smaller than a first absolute value. The first absolute value is of a difference between a first potential difference and a second potential difference. The first potential difference is between the first and second terminals. The second potential difference is between the first and fourth terminals. The second absolute value is of a difference between the first and third potential differences. The third potential difference is between the first and sixth terminals.

19 Claims, 4 Drawing Sheets

(51) Int. Cl.
    *H02J 3/38*      (2006.01)
    *H01L 31/0687*   (2012.01)
    *H01L 31/032*    (2006.01)
    *H02S 40/30*     (2014.01)
    *H01L 31/02*     (2006.01)
    *H01L 31/05*     (2014.01)
    *H01L 31/028*    (2006.01)

(52) U.S. Cl.
    CPC ...... *H01L 31/0322* (2013.01); *H01L 31/0504* (2013.01); *H01L 31/0687* (2013.01); *H02S 40/30* (2014.12)

(56) References Cited

U.S. PATENT DOCUMENTS

| | | | |
|---|---|---|---|
| 10,164,130 B2* | 12/2018 | Choi | H01L 31/0201 |
| 2005/0268957 A1 | 12/2005 | Enomoto et al. | |
| 2008/0150366 A1* | 6/2008 | Adest | H02M 3/1582 307/77 |
| 2011/0067745 A1 | 3/2011 | Ledenev et al. | |
| 2014/0332058 A1* | 11/2014 | Hong | H01L 31/0481 136/251 |
| 2015/0083186 A1 | 3/2015 | Shibasaki et al. | |
| 2015/0381109 A1* | 12/2015 | Choi | H01L 31/0201 136/251 |
| 2016/0105144 A1* | 4/2016 | Haynes | H01L 31/048 136/244 |
| 2017/0126010 A1* | 5/2017 | Canales | H02M 3/28 |

FOREIGN PATENT DOCUMENTS

| | | |
|---|---|---|
| JP | 2011-008348 | 1/2011 |
| JP | 2011-129833 | 6/2011 |
| JP | 2012-109555 | 6/2012 |
| JP | 2012-114300 | 6/2012 |
| JP | 5498388 | 5/2014 |
| JP | 5508271 | 5/2014 |
| JP | 2015-065249 | 4/2015 |
| JP | 2016-167974 | 9/2016 |

* cited by examiner

SOLAR CELL SYSTEM AND METHOD FOR CONTROLLING SOLAR CELL SYSTEM

CROSS-REFERENCE TO RELATED APPLICATIONS

This application is based upon and claims the benefit of priority from Japanese Patent Application No. 2017-178757, filed on Sep. 19, 2017; the entire contents of which are incorporated herein by reference.

FIELD

Embodiments described herein relate generally to a solar cell system and a method for controlling solar cell system.

BACKGROUND

For example, there is a solar cell system that uses multiple solar cells. It is desirable to obtain stable electrical power in the solar cell system.

DETAILED DESCRIPTION

Figure 1:
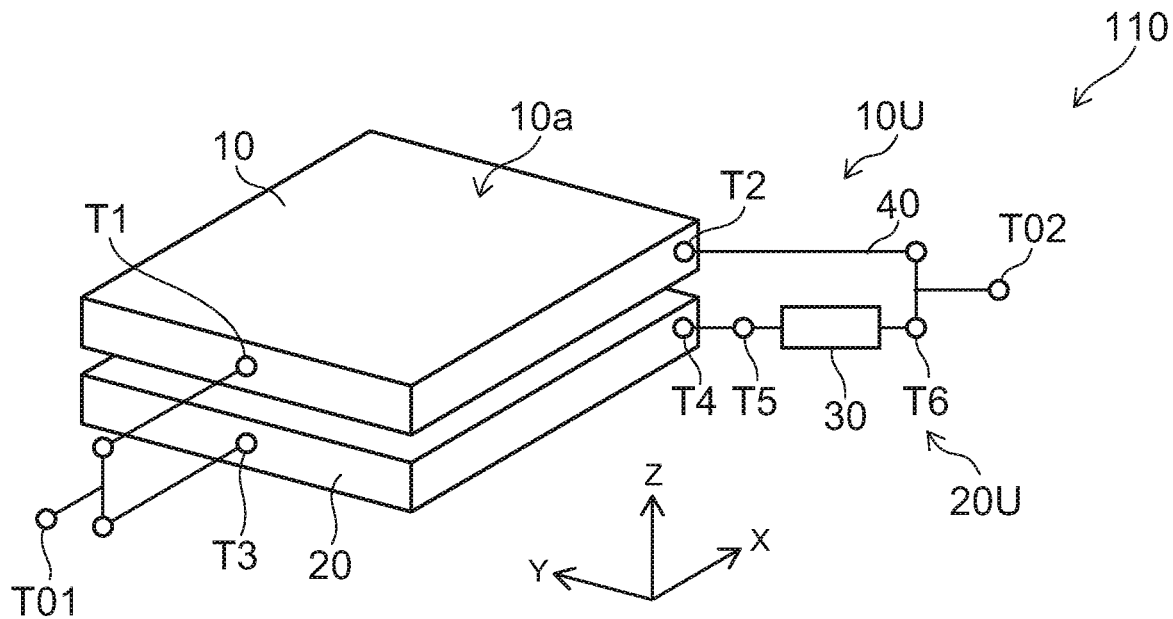
FIG. 1 is a schematic view illustrating a solar cell system according to a first embodiment.

According to one embodiment, a solar cell system includes a first solar cell including a first terminal and a second terminal, a second solar cell including a third terminal and a fourth terminal, and a voltage converter including a fifth terminal and a sixth terminal. The third terminal is electrically connected to the first terminal. The fifth terminal is electrically connected to the fourth terminal. The voltage converter is configured to cause a second absolute value to be smaller than a first absolute value. The first absolute value is of a difference between a first potential difference and a second potential difference. The first potential difference is between the first terminal and the second terminal. The second potential difference is between the first terminal and the fourth terminal. The second absolute value is of a difference between the first potential difference and a third potential difference. The third potential difference is between the first terminal and the sixth terminal.

According to another embodiment, a method for controlling a solar cell system is disclosed. The solar cell system includes a first generator and a second generator. The first generator includes a first solar cell. The second generator includes a second solar cell connected in parallel with the first generator. The method can include converting a second solar cell voltage of the second solar cell to reduce a difference between a first output voltage of the first generator and a second output voltage of the second generator.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic view illustrating a solar cell system according to a first embodiment.

As shown in FIG. 1, the solar cell system 110 according to the embodiment includes a first solar cell 10, a second solar cell 20, and a voltage converter 30.

In the example, the first solar cell 10 overlaps the second solar cell 20. For example, the first solar cell 10 has a first surface 10a. The first solar cell 10 spreads along the first surface 10a.

For example, the first surface 10a is aligned with the X-Y plane. A direction perpendicular to the X-Y plane is taken as a Z-axis direction. One direction aligned with the X-Y plane is taken as an X-axis direction. A direction perpendicular to the X-axis direction and the Z-axis direction is taken as a Y-axis direction.

In the example, the second solar cell 20 overlaps the first solar cell 10 in the Z-axis direction. For example, at least a portion of the second solar cell 20 may overlap at least a portion of the first solar cell 10 in a first direction crossing the first surface 10a (the X-Y plane). As described below, for example, a direction from the second solar cell 20 toward the first solar cell 10 may cross the Z-axis direction.

The first solar cell 10 and the second solar cell 20 are connected in parallel with each other. For example, the first solar cell 10 includes a first terminal T1 and a second terminal T2. The second solar cell 20 includes a third terminal T3 and a fourth terminal T4. The third terminal T3 is electrically connected to the first terminal T1.

The voltage converter 30 includes a fifth terminal T5 and a sixth terminal T6. The fifth terminal T5 is electrically connected to the fourth terminal T4.

An interconnect 40 is further provided in the example. The interconnect 40 electrically connects the sixth terminal T6 and the second terminal T2.

Multiple generators (a first generator 10U, a second generator 20U, etc.) are provided in the embodiment. The first generator 10U includes the first solar cell 10. The second generator 20U includes the second solar cell 20 and the voltage converter 30. The first generator 10U and the second generator 20U are electrically connected in parallel with each other.

The solar cell system 110 includes two terminals (terminals T01 and T02). These terminals are used as the output terminals of the solar cell system 110. The first terminal T1 and the third terminal T3 are used as the terminal T01. In the case where the interconnect 40 is provided, the second terminal T2 and the sixth terminal T6 are electrically connected to the terminal T02.

Figure 2:
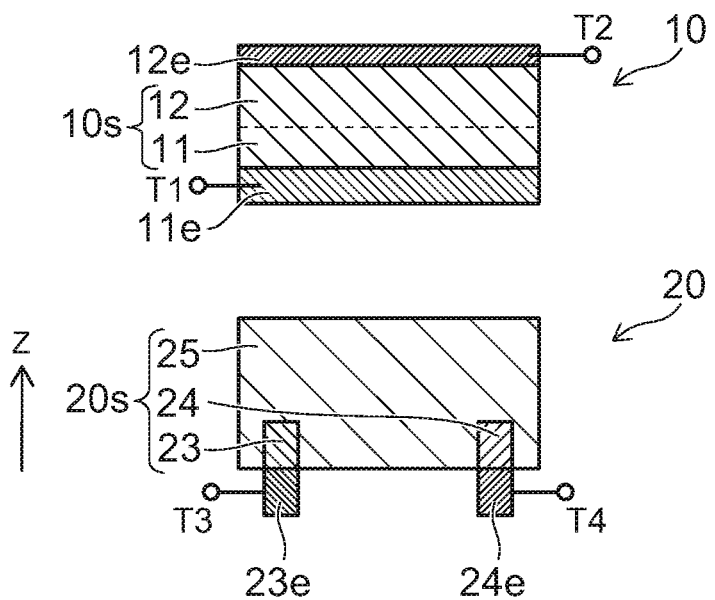
FIG. 2 is a schematic cross-sectional view illustrating a portion of the solar cell system according to the first embodiment.

FIG. 2 is a schematic cross-sectional view illustrating a portion of the solar cell system according to the first embodiment. As shown in FIG. 2, the first solar cell 10 includes a first photoelectric conversion layer 10s. The first terminal T1 is electrically connected to a portion of the first photoelectric conversion layer 10s. The second terminal T2 is electrically connected to another portion of the first photoelectric conversion layer 10s.

In the example, the first photoelectric conversion layer 10s includes a first semiconductor region 11 and a second semiconductor region 12. The first semiconductor region 11 is of a first conductivity type. The second semiconductor region 12 is of a second conductivity type. For example, the first conductivity type is a p-type; and the second conductivity type is an n-type. The conductivity types may be reversed.

A first electrode 11e and a second electrode 12e are provided in the example. The first photoelectric conversion layer 10s is provided between the first electrode 11e and the second electrode 12e. In the example, the first semiconductor region 11 is positioned between the first electrode 11e and the second electrode 12e. The second semiconductor region 12 is positioned between the first semiconductor region 11 and the second electrode 12e. The first terminal T1 is electrically connected to the first electrode 11e. The second terminal T2 is electrically connected to the second electrode 12e.

In one example, the first photoelectric conversion layer 10s includes a compound semiconductor.

On the other hand, the second solar cell 20 includes a second photoelectric conversion layer 20s. The third terminal T3 is electrically connected to a portion of the second photoelectric conversion layer 20s. The fourth terminal T4 is electrically connected to another portion of the second photoelectric conversion layer 20s.

In the example, the second photoelectric conversion layer 20s includes a third semiconductor region 23, a fourth semiconductor region 24, and a fifth semiconductor region 25. For example, the third semiconductor region 23 is of the first conductivity type. The fourth semiconductor region 24 is of the second conductivity type. The conductivity of the fifth semiconductor region 25 is, for example, lower than the conductivity of the third semiconductor region 23 and lower than the conductivity of the fourth semiconductor region 24. The third semiconductor region 23 includes, for example, a p-type silicon region. The fourth semiconductor region 24 includes, for example, an n-type silicon region. The fifth semiconductor region 25 includes, for example, non-doped silicon.

For example, the portion of the first photoelectric conversion layer 10s recited above that is electrically connected to the first terminal T1 is of the first conductivity type. The other portion of the first photoelectric conversion layer 10s recited above that is electrically connected to the second terminal T2 is of the second conductivity type. The portion of the second photoelectric conversion layer 20s recited above that is electrically connected to the third terminal T3 is of the first conductivity type. The other portion of the second photoelectric conversion layer 20s recited above that is electrically connected to the fourth terminal T4 is of the second conductivity type.

Thus, the first solar cell 10 and the second solar cell 20 are electrically connected to each other. Thus, the first generator 10U and the second generator 20U are electrically connected to each other.

Figure 3:
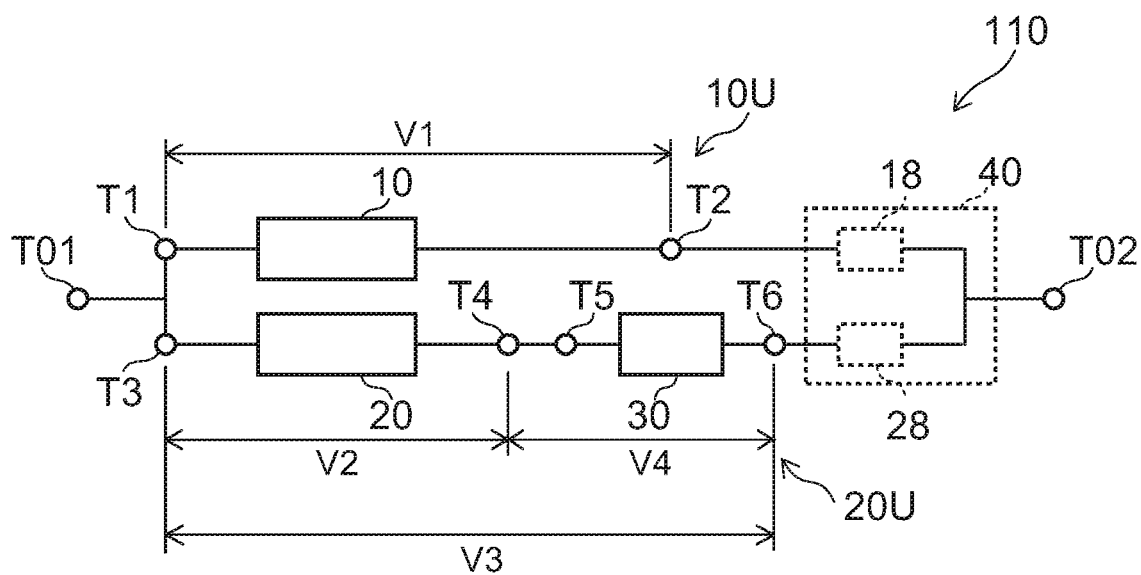
FIG. 3 is a schematic view illustrating the solar cell system according to the first embodiment.

FIG. 3 is a schematic view illustrating the solar cell system according to the first embodiment.

Photovoltaic power is generated in the first solar cell 10 by light (e.g., sunlight) that is incident on the first solar cell 10. Photovoltaic power is generated in the second solar cell 20 by light (e.g., sunlight) that is incident on the second solar cell 20.

The potential difference between the first terminal T1 and the second terminal T2 is taken as a first potential difference V1. The first potential difference V1 corresponds to the output voltage (the open circuit voltage) generated by the first solar cell 10.

The potential difference between the first terminal T1 and the fourth terminal T4 is taken as a second potential difference V2. The second potential difference V2 corresponds to the potential difference between the third terminal T3 and the fourth terminal T4. The second potential difference V2 corresponds to the output voltage (the open circuit voltage) generated by the second solar cell 20.

The potential difference between the first terminal T1 and the sixth terminal T6 is taken as a third potential difference V3. The third potential difference V3 corresponds to the output voltage obtained by the second generator 20U including the second solar cell 20 and the voltage converter 30.

The voltage converter 30 causes a second absolute value of the difference between the first potential difference V1 and the third potential difference V3 to be smaller than a first absolute value of the difference between the first potential difference V1 and the second potential difference V2.

Thereby, for example, a solar cell system can be provided in which stable electrical power can be obtained.

For example, the voltage converter 30 converts the voltage of the output voltage (the second potential difference V2) generated by the second solar cell 20. The voltage that is obtained by the conversion is the third potential difference V3. The voltage converter 30 causes the output voltage (the third potential difference V3) of the second generator 20U to approach the output voltage (the first potential difference V1) of the first generator 10U.

For example, the output voltage (the first potential difference V1) obtained by the first solar cell 10 and the output voltage (the second potential difference V2) obtained by the second solar cell 20 are not always the same. Loss occurs in the obtained electrical power when multiple solar cells having different output voltages are connected in parallel.

In the embodiment, even in the case where multiple solar cells having different output voltages are connected in parallel, the difference between the output voltages of the multiple generators can be reduced by the voltage converter 30. The loss of the electrical power can be suppressed.

For example, a reference example may be considered in which the output voltages of the multiple solar cells are designed to be uniform without providing the voltage converter 30. In such a case, for example, there is a limit to setting the output voltages of the multiple solar cells to be uniform due to fluctuation of the manufacturing conditions, etc. Further, when using after the manufacturing, there are also cases where the output voltages of the multiple solar cells become nonuniform because the characteristics of the multiple solar cells change. For example, the output voltage changes when some of the multiple solar cells degrade. Also, the change over time of the output voltage is different in the case where portions (e.g., the photoelectric conversion layers) of the multiple solar cells include different materials. In the reference example, it is difficult to sufficiently reduce the nonuniformity of the output voltage due to such various factors.

By providing the voltage converter 30 in the embodiment, the output voltage of at least one of the multiple generators can be adjusted. Thereby, the difference between the output voltages of the multiple generators can be small. The loss of the electrical power can be suppressed.

For example, the first solar cell 10 has a maximum output point. The voltage at the maximum output point of the first solar cell 10 is taken as a first voltage. For example, the second solar cell 20 has a maximum output point. The voltage at the maximum output point of the second solar cell 20 is taken as a second voltage. The first voltage is not always the same as the second voltage. In the embodiment, the first potential difference V1 may be the first voltage. The second potential difference V2 may be the second voltage.

In the embodiment, for example, a first resistor 18 may be provided between the second terminal T2 and the terminal T02. For example, a second resistor 28 may be provided between the sixth terminal T6 and the terminal T02. These resistors include, for example, the interconnect resistance, etc. These resistors may be included in the interconnect 40. These resistors substantially may be ignored.

For example, the potential difference between the fifth terminal T5 and the sixth terminal T6 is taken as a fourth potential difference V4. The third potential difference V3 substantially corresponds to the sum of the second potential difference V2 and the third potential difference V3. The third potential difference V3 may be positive or may be negative.

In one example, the absolute value of the first potential difference V1 is greater than the absolute value of the second potential difference V2. In such a case, the fourth potential difference V4 is positive. In another example, the absolute value of the first potential difference V1 is less than the absolute value of the second potential difference V2. In such a case, the fourth potential difference V4 is negative.

Figure 4A:
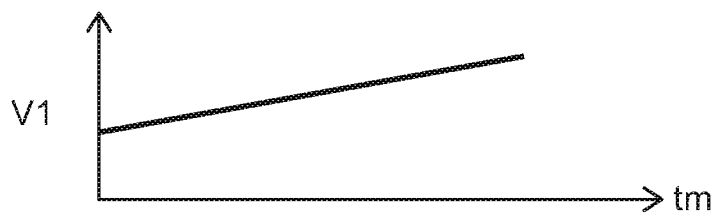
FIG. 4A to FIG. 4C are schematic views illustrating characteristics of the solar cell system according to the first embodiment.
Figure 4B:
Figure 4C:
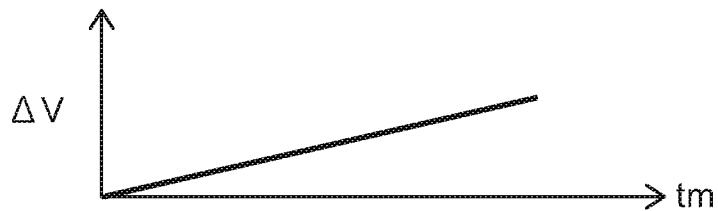

FIG. 4A to FIG. 4C are schematic views illustrating characteristics of the solar cell system according to the first embodiment.

In these figures, the horizontal axis is a time tm. The vertical axis of FIG. 4A is the first potential difference V1. The vertical axis of FIG. 4B is the second potential difference V2. The vertical axis of FIG. 4C is a difference ΔV between the first potential difference V1 and the second potential difference V2. The first absolute value recited above corresponds to the absolute value of the difference ΔV.

In one example as shown in FIG. 4A, the first potential difference V1 increases as the time tm elapses. On the other hand, in one example as shown in FIG. 4B, the second potential difference V2 decreases as the time tm elapses. In the one example as shown in FIG. 4C, the difference ΔV increases as the time tm elapses.

In such a case, the difference ΔV increases as the time tm elapses even in the case where the output voltages of the initial states of these solar cells are designed to be the same. In such a case, the output voltage can be set to be uniform by providing the voltage converter 30.

For example, the characteristic illustrated in FIG. 4A is obtained in the case where the first photoelectric conversion layer 10s of the first solar cell 10 includes a chalcopyrite material. The characteristic illustrated in FIG. 4B is obtained in the case where the second photoelectric conversion layer 20s of the second solar cell 20 includes silicon.

In the case where such a combination of materials is used, the output voltage can be effectively set to be uniform by providing the voltage converter 30.

In the embodiment, the voltage converter 30 includes, for example, a DC-DC converter. The second potential difference V2 can be converted into the third potential difference V3 by the DC-DC converter.

As recited above, the first potential difference V1 increases in the first interval. On the other hand, the second potential difference V2 decreases in the first interval. The first absolute value (the absolute value of the difference V) recited above changes temporally. The voltage converter 30 modifies the absolute value of the third potential difference V3 according to the temporal change of the first absolute value. Thereby, even in the case where the difference between the output voltages of the two solar cells changes temporally, the difference between the output voltages of the two generators can be maintained to be small.

For example, even in the case where the polarities of the temporal changes of the output voltages are the same, the absolute values of the temporal changes may be different. Even in such a case, the difference between the output voltages of the two generators can be maintained to be small by the voltage converter 30.

For example, the change in the first interval of the first absolute value (the absolute value of the difference ΔV between the first potential difference V1 and the second potential difference V2) is larger than the change in the first interval of the second absolute value (the absolute value of the difference between the first potential difference V1 and the third potential difference V3). Or, the second absolute value recited above substantially does not change in the first interval. Thus, in the embodiment, the second absolute value (the absolute value of the difference between the first potential difference V1 and the third potential difference V3) that is obtained by the voltage converter 30 can be set to be small.

The voltage converter 30 modifies the fourth potential difference V4 (the potential difference between the fifth terminal T5 and the sixth terminal T6) according to the temporal change of the first absolute value (the absolute value of the difference ΔV between the first potential difference V1 and the second potential difference V2). The voltage converter 30 modifies the absolute value of the fourth potential difference V4 according to the temporal change of the first absolute value.

Figure 5:
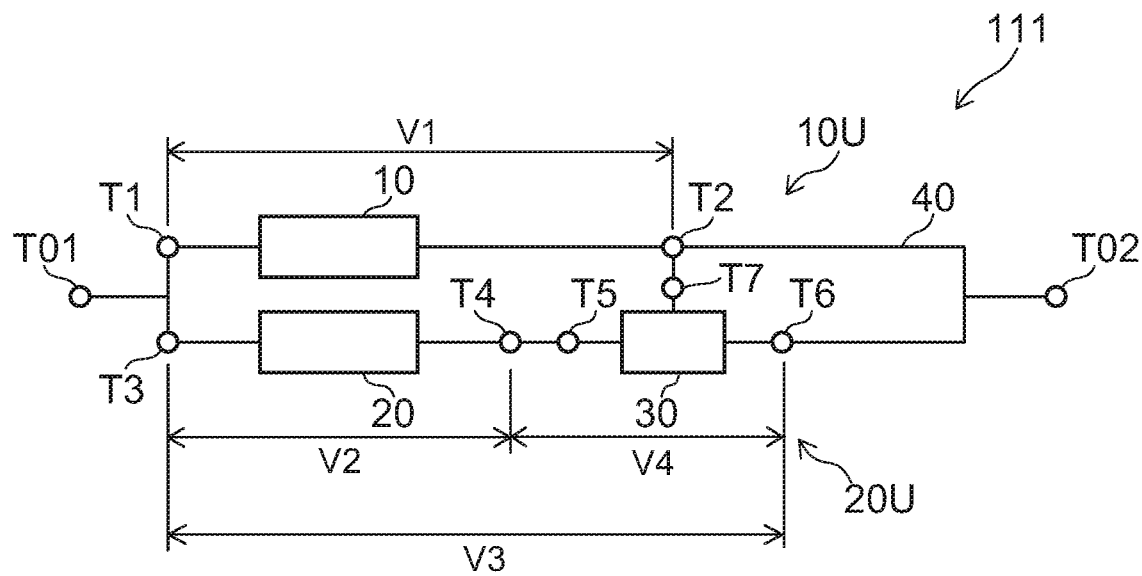
FIG. 5 is a schematic view illustrating another solar cell system according to the first embodiment.

FIG. 5 is a schematic view illustrating another solar cell system according to the first embodiment.

In the solar cell system 111 as shown in FIG. 5, the voltage converter 30 further includes a seventh terminal T7. Otherwise, the configuration of the solar cell system 111 is similar to the configuration of the solar cell system 110. The resistors are not illustrated in FIG. 5.

In the solar cell system 111, a signal that corresponds to the first potential difference V1 is input to the seventh terminal T7. The potential (e.g., the third potential difference V3) of the sixth terminal T6 changes according to the signal. The seventh terminal T7 is the control terminal of the voltage converter 30. The potential of the sixth terminal T6 (the output terminal) changes when the potential of the seventh terminal T7 is changed.

A signal that corresponds to the first potential difference V1 may be input to the seventh terminal T7; and the difference between the first potential difference V1 and the second potential difference V2 may be derived in the voltage converter 30. The potential (e.g., the third potential difference V3) of the sixth terminal T6 may change according to the difference.

Figure 6:
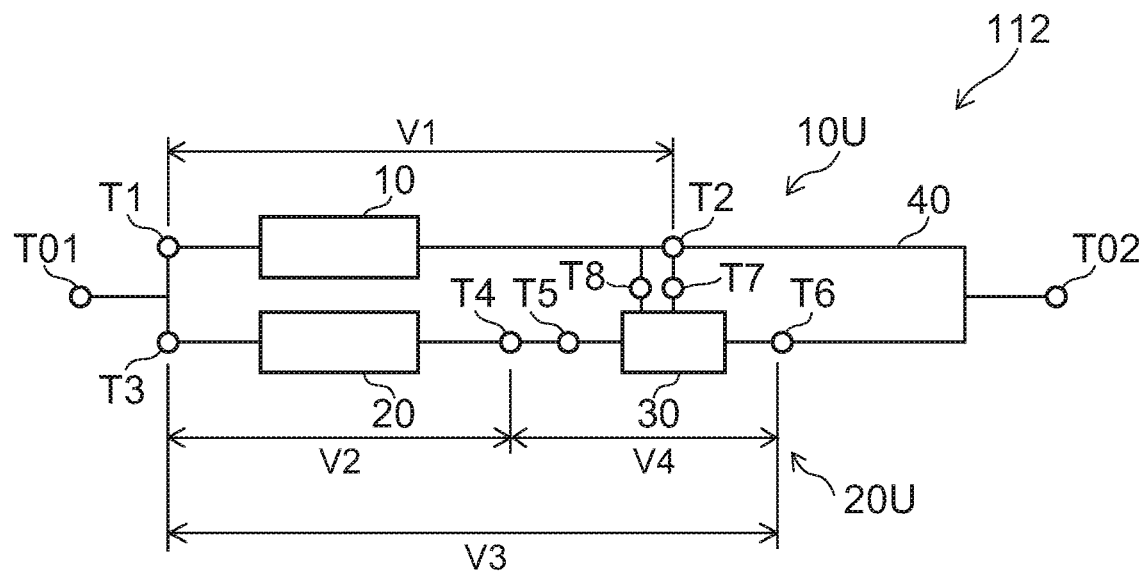
FIG. 6 is a schematic view illustrating another solar cell system according to the first embodiment.

FIG. 6 is a schematic view illustrating another solar cell system according to the first embodiment.

In the solar cell system 112 as shown in FIG. 6, the voltage converter 30 further includes a power supply terminal T8. Otherwise, the configuration of the solar cell system 112 is similar to the configuration of the solar cell system 111. The resistors are not illustrated in FIG. 6.

In the solar cell system 112, for example, electrical power that is from the first solar cell 10 is supplied to the power supply terminal T8. In the embodiment, electrical power that is from the second solar cell 20 may be supplied to the power supply terminal T8. Electrical power that is from an external power supply may be supplied to the power supply terminal T8.

Figure 7:
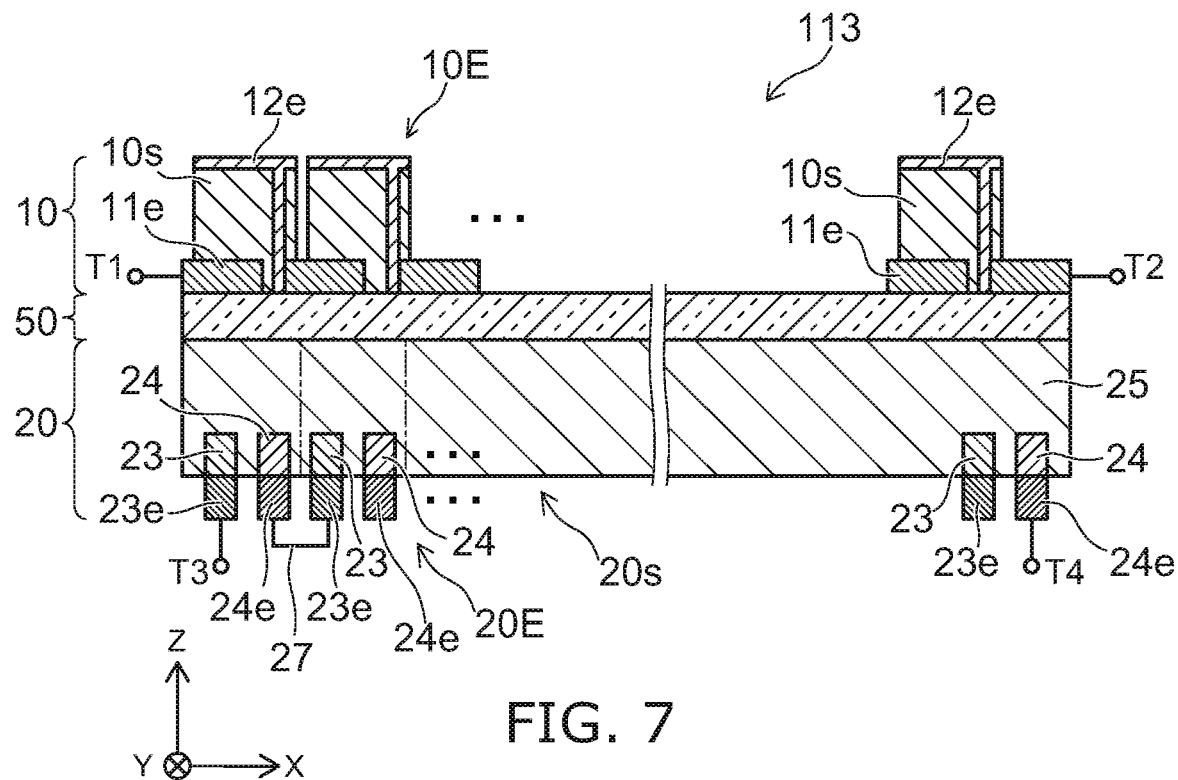
FIG. 7 is a schematic cross-sectional view illustrating a portion of another solar cell system according to the first embodiment.

FIG. 7 is a schematic cross-sectional view illustrating a portion of another solar cell system according to the first embodiment.

In the solar cell system 113 as shown in FIG. 7, the first solar cell 10 includes multiple first solar cell elements 10E. The second solar cell 20 includes multiple second solar cell elements 20E. The voltage converter 30 is not illustrated in FIG. 7.

In the first solar cell 10, for example, at least a portion of the multiple first solar cell elements 10E is connected in series. The first terminal T1 is electrically connected to one of the multiple first solar cell elements 10E. The second terminal T2 is connected to another one of the multiple first solar cell elements 10E.

In the second solar cell 20, for example, at least a portion of the multiple second solar cell elements 20E is connected in series. For example, the third electrode 23e of one of the multiple second solar cell elements 20E and the fourth electrode 24e of another one of the multiple second solar cell elements 20E are electrically connected to each other. In the example, these electrodes are connected by a conductive portion 27. The third terminal T3 is connected to one of the multiple second solar cell elements 20E. The fourth terminal T4 is connected to another one of the multiple second solar cell elements 20E.

The desired voltage is obtained by connecting the multiple solar cell elements in series.

In the example, an intermediate layer 50 is provided between the first solar cell 10 and the second solar cell 20. The intermediate layer 50 is light-transmissive. The intermediate layer 50 includes, for example, glass, etc. For example, the light (e.g., the sunlight) that is incident on the first solar cell 10 passes through the intermediate layer 50 and is incident on the second solar cell 20.

For example, a portion of the light incident on the first solar cell 10 is converted into electrical power by the first solar cell 10. Another portion of the light is incident on the second solar cell 20 and is converted into electrical power. Efficient power generation is performed. The solar cell system 113 is, for example, a tandem solar cell.

A first bandgap of the first photoelectric conversion layer 10s is different from a second bandgap of the second photoelectric conversion layer 20s. For example, the first bandgap is larger than the second bandgap. By such a configuration, more efficient photoelectric conversion can be performed using the light incident on the solar cell system 113.

The bandgap of the first photoelectric conversion layer 10s may change in the thickness direction. In such a case, the minimum of the bandgap of the first photoelectric conversion layer 10s can be used as the first bandgap of the first photoelectric conversion layer 10s. The first photoelectric conversion layer 10s may include multiple photoelectric conversion films. The multiple photoelectric conversion films are stacked with each other. In such a case, the bandgap of the photoelectric conversion film of the multiple photoelectric conversion films having the maximum thickness can be used as the first bandgap of the first photoelectric conversion layer 10s.

Figure 8:
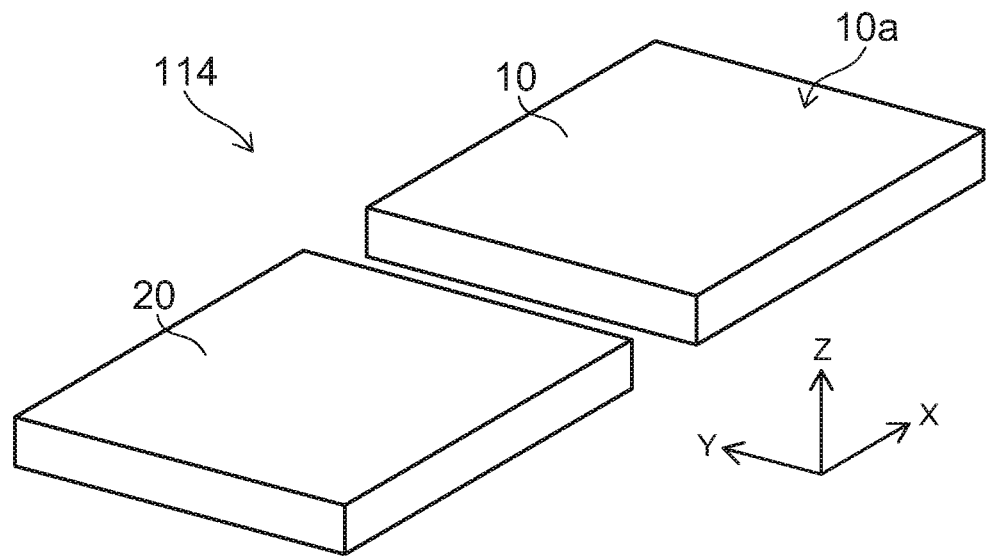
FIG. 8 is a schematic cross-sectional view illustrating a solar cell system according to the first embodiment.

FIG. 8 is a schematic cross-sectional view illustrating a solar cell system according to the first embodiment.

The voltage converter 30 is not illustrated in FIG. 8. In the solar cell system 114 as shown in FIG. 8, the direction from the second solar cell 20 toward the first solar cell 10 crosses the Z-axis direction. For example, the direction from the second solar cell 20 toward the first solar cell 10 is aligned with the first surface 10a.

In the solar cell systems 111 to 114 as well, a solar cell system can be provided in which stable electrical power can be obtained.

In the embodiments, the first semiconductor region 11 may include CIGSe. The second semiconductor region 12 may include CdS. The second semiconductor region 12 may include, for example, Zn and at least one of O or S. The second semiconductor region 12 may include, for example, $ZnO_{1-x1}S_{x1}$ ($0 \leq x1 \leq 1$).

In the embodiments, the electrodes (at least one of the first electrode 11e, the second electrode 12e, the third electrode 23e, or the fourth electrode 24e) may include multiple films. The multiple films overlap each other. One of the multiple films may include, for example, an oxide including at least one of In, Zn, or Sn. Another one of the multiple films may be a metal film.

In the embodiments, the second solar cell 20 may include, for example, an interdigitated back contact Si cell (interdigitated back contact Si cell). The second solar cell 20 may include, for example, polycrystalline silicon.

In one example, the first solar cell 10 is a CIGSSe panel. On the other hand, the second solar cell 20 is a silicon panel.

An example of a method for manufacturing the first solar cell 10 will now be described. In the following example, the first solar cell 10 is a CIGSSe panel.

High transmittance glass or soda-lime glass is used as a substrate. An ITO film (having a thickness of 150 nm) and a $SnO_2$ film (having a thickness of 100 nm) are formed by sputtering as a light-transmissive electrode on the backside. Holes are formed in the light-transmissive electrode by lithography; and a metal film is introduced to the holes. The light-transmissive electrode is covered with an insulating film of $SiN_x$, etc. Thereby, the contact between the light-transmissive electrode and the photoelectric conversion layer (e.g., the chalcopyrite material layer) can be suppressed.

The substrate is heated (e.g., about 200° C.); and a film that includes In and Ga—Cu is formed by sputtering. The temperature of the substrate is increased; and the substrate is selenided by processing using $H_2Se$. Subsequently, the front surface may be sulfidized using $H_2S$ by changing the substrate temperature, etc.

A serially-connected structure is formed as appropriate by mechanical scribing or laser scribing.

A CdS layer is formed on the substrate by CBD (Chemical Bath Deposition). For example, the substrate is dipped in a solution obtained by dissolving cadmium sulfate in an ammonia aqueous solution. Thiourea is further introduced to the solution. The substrate is removed 45 seconds after the introduction of the thiourea; and the substrate is rinsed with water. Subsequently, an organic Zn compound is coated onto the substrate by, for example, spraying. Heating is performed for 5 minutes at a temperature not less than 50° C. and not more than 120° C. Thereby, a ZnO layer (e.g., a protective layer) is formed. The thickness of the ZnO layer is, for example, not less than 15 nm and not more than 30 nm.

Further, a ZnO:Al film is formed by sputtering as a light-transmissive electrode on the upper portion side. The ZnO:Al film is a film (e.g., a $Zn_{1-x2}Al_{x2}O_{y2}$ film ($0 \le x2 \le 1$ and $0.9 \le y2 \le 1.5$)) including oxygen and at least one selected from the group consisting of Zn and Al. Or, a ZnO:B film is formed by CVD as the light-transmissive electrode on the upper portion side. The ZnO:B film is a film (e.g., a $Zn_{1-x3}B_{x3}O_{y3}$ film ($0 \le x3 \le 1$ and $0.9 \le y3 \le 1.1$)) including oxygen and at least one selected from the group consisting of Zn and B. In the formation by sputtering, the temperature of the substrate is not less than 60° C. and not more than 150° C. The open circuit voltage easily becomes large by forming the film at a low temperature.

$MgF_2$ is vapor-deposited on the light-transmissive electrode on the upper portion side. The $MgF_2$ film functions as, for example, a reflection suppression film (an anti-reflection film). The thickness of the $MgF_2$ film is, for example, not less than 70 nm and not more than 130 nm (e.g., not less than 80 nm and not more than 120 nm). Thus, the CIGSSe panel (the first solar cell 10) is obtained.

For example, three of the CIGSSe panels are provided in parallel. Thereby, the output voltage is adjusted when combined with the silicon panels.

An anti-reflection film is provided under the CIGSSe panel (the first solar cell 10) recited above. A silicon panel (the second solar cell 20) is further provided under the anti-reflection film.

For example, the back surface is protected by using a film of EVA, etc., to protect against moisture. A set of such a CIGSSe panel and a silicon panel is housed in a frame. A junction box is prepared; and the connectors of the CIGSSe panel and the silicon panel are prepared. In such a case, it is favorable to use connectors having four electrodes to easily provide the interconnects. It is favorable for the connectors to have configurations such that the orientations of insertion can be limited. A DC-DC converter is provided as the voltage converter 30; and the members each are electrically connected by interconnects.

In a first configuration, the first solar cell 10, the second solar cell 20, and the voltage converter 30 are provided as described above. The output voltage (the open circuit voltage) of the first solar cell 10 is different from the output voltage (the open circuit voltage) of the second solar cell 20.

In a second configuration, the first solar cell 10 and the second solar cell 20 are provided; and the voltage converter 30 is not provided. The output voltage (the open circuit voltage) of the first solar cell 10 is different from the output voltage (the open circuit voltage) of the second solar cell 20. The first solar cell 10 and the second solar cell 20 are connected in parallel.

In a third configuration, the first solar cell 10 and the second solar cell 20 are provided; and the voltage converter 30 is not provided. A portion of the multiple first solar cell elements 10E included in the first solar cell 10 is connected in parallel; and a portion of the multiple second solar cell elements 20E included in the second solar cell 20 is connected in parallel. Thereby, the output voltage (the open circuit voltage) of the first solar cell 10 is substantially the same as the output voltage (the open circuit voltage) of the second solar cell 20. The first solar cell 10 and the second solar cell 20 are connected in parallel.

In the first configuration, the efficiency is 25.1%; an open circuit voltage Voc is 37.8 V; and a short circuit current Isc is 14.0 A.

In the second configuration, the efficiency is 24.4%; the open circuit voltage Voc is 37.5 V; and the short circuit current Isc is 13.8 A.

In the third configuration, the efficiency is 24.7%; the open circuit voltage Voc is 37.6 V; and the short circuit current Isc is 13.9 A.

Thus, in the first configuration, a high efficiency is obtained.

In the example of the method for manufacturing the first solar cell 10, for example, a light-transmissive electrode is formed. Subsequently, a metal film is formed. Subsequently, a first scribing is performed. Subsequently, a CIGSSe film is formed. Subsequently, a second scribing is performed. Subsequently, CBD is performed. Subsequently, a ZnO film is formed. Subsequently, a ZnO:Al film is formed. Subsequently, a third scribing is performed. Subsequently, an anti-reflection film is formed.

In the embodiments, the order may be reversed between the second scribing and "the CBD and the formation of the ZnO film." In the embodiments, the order may be reversed between the third scribing and the formation of the anti-reflection film.

For example, the spacing of the scribing in the first scribing is, for example, not less than 5 mm and not more than 8 mm. If the spacing is excessively short, for example, the loss increases and the power generation area decreases for the second scribing or the third scribing. If the spacing is excessively long, for example, loss occurs due to the resistance component of the electrode (e.g., at least one of the ZnO:Al film or the ZnO:B film). The resistance decreases in the case where the electrode is set to be thick. In the case where the electrode is set to be thick, optical loss occurs; and the efficiency decreases.

The first photoelectric conversion layer 10s that is included in the first solar cell 10 includes, for example, at least one selected from the group consisting of CdTe, $Cu_2O$, and CuInGaSSe.

The second solar cell 20 includes, for example, a silicon solar cell or a CIGSSe solar cell.

For example, the output voltage of one of the first solar cell 10 or the second solar cell 20 is higher than the output voltage of the other of the first solar cell 10 or the second solar cell 20. In such a case, the one of the first solar cell 10 or the second solar cell 20 is connected in parallel. Such a first solar cell 10 and such a second solar cell 20 are connected in parallel.

In the case of a series connection, constraints occur easily in the bandgaps of the multiple solar cells. For example, in the case of a difference between the currents of the multiple solar cells, the obtained current is limited by the smaller current. For example, there are also cases where a difference occurs between the currents of the multiple solar cells because the wavelength distribution of the incident light changes. In such a case as well, the obtained current is limited by the smaller current.

In the case of a parallel connection, the voltages are set to be substantially equal. For example, the voltages may be adjusted by adjusting the spacing of the scribing. In the solar cell, the current changes greatly with respect to the light amount; but the voltage does not change greatly if the illuminance is of some level. Therefore, a large effect does not occur even when the wavelength distribution of the light changes.

In the embodiments, at least one of a series connection or a parallel connection may be used for the first solar cell 10. At least one of a series connection or a parallel connection may be used for the second solar cell 20. For example, solar cell element groups that are connected in series may be multiply provided. At least a portion of the multiple solar cell element groups may be connected in parallel. For example, solar cell element groups that are connected in parallel may be multiply provided. At least a portion of the multiple solar cell element groups may be connected in series.

Second Embodiment

A second embodiment relates to a method for controlling a solar cell system. The solar cell system includes the first generator 10U and the second generator 20U (referring to FIG. 1). The second generator 20U is connected in parallel with the first generator 10U. The first generator 10U includes the first solar cell 10. The second generator 20U includes the second solar cell 20.

In the control method, the second solar cell voltage (the second potential difference V2) of the second solar cell 20 is converted to reduce the difference between the first output voltage (e.g., the first potential difference V1) of the first generator 10U and the second output voltage (the third potential difference V3) of the second generator 20U. According to the embodiment, a method for controlling a solar cell system can be provided in which stable electrical power can be obtained.

In one example, a first solar cell voltage (e.g., the first potential difference V1) of the first solar cell 10 increases in the first interval. On the other hand, a second solar cell voltage (e.g., the second potential difference V2) decreases in the first interval (referring to FIGS. 4A and 4B).

For example, the absolute value of the change in the first interval of the first output voltage (e.g., the first potential difference V1) is larger than the change in the first interval of the absolute value of the difference between the first output voltage (e.g., the first potential difference V1) and the second output voltage (e.g., the third potential difference V3). Or, the absolute value of the difference between the first output voltage (e.g., the first potential difference V1) and the second output voltage (e.g., the third potential difference V3) substantially does not change in the first interval.

In the control method, the conversion rate of the second solar cell voltage (the second potential difference V2) is changed according to the temporal change of the absolute value of the difference between the first output voltage (e.g., the first potential difference V1) and the second output voltage (e.g., the third potential difference V3).

In the embodiments, another solar cell may be further provided in addition to the first solar cell 10 and the second solar cell 20. The number of solar cells may be three or more. In the embodiments, another voltage converter may be further provided in addition to the voltage converter 30. The number of voltage converters may be two or more.

The embodiments may include the following configurations (e.g., technological proposals).

Configuration 1

A solar cell system, comprising:
a first solar cell including a first terminal and a second terminal;
a second solar cell including a third terminal and a fourth terminal, the third terminal being electrically connected to the first terminal; and
a voltage converter including a fifth terminal and a sixth terminal, the fifth terminal being electrically connected to the fourth terminal,
the voltage converter causing a second absolute value to be smaller than a first absolute value, the first absolute value being of a difference between a first potential difference and a second potential difference, the first potential difference being between the first terminal and the second terminal, the second potential difference being between the first terminal and the fourth terminal, the second absolute value being of a difference between the first potential difference and a third potential difference, the third potential difference being between the first terminal and the sixth terminal.

Configuration 2

The solar cell system according to Configuration 1, further comprising an interconnect electrically connecting the sixth terminal and the second terminal.

Configuration 3

The solar cell system according to Configuration 1 or 2, wherein
the first solar cell includes a first photoelectric conversion layer,
the first terminal is electrically connected to a portion of the first photoelectric conversion layer,
the second terminal is electrically connected to another portion of the first photoelectric conversion layer,
the second solar cell includes a second photoelectric conversion layer,
the third terminal is electrically connected to a portion of the second photoelectric conversion layer, and
the fourth terminal is electrically connected to another portion of the second photoelectric conversion layer.

Configuration 4

The solar cell system according to Configuration 3, wherein
the portion of the first photoelectric conversion layer is of a first conductivity type,
the other portion of the first photoelectric conversion layer is of a second conductivity type,
the portion of the second photoelectric conversion layer is of the first conductivity type, and
the other portion of the second photoelectric conversion layer is of the second conductivity type.

Configuration 5

The solar cell system according to either Configuration 3 or 4, wherein a first bandgap of the first photoelectric conversion layer is different from a second bandgap of the second photoelectric conversion layer.

Configuration 6

The solar cell system according to Configuration 5, wherein the first bandgap is larger than the second bandgap.

Configuration 7

The solar cell system according to any one of Configurations 1 to 6, wherein the first absolute value changes temporally.

Configuration 8

The solar cell system according to any one of Configurations 1 to 6, wherein
the first potential difference increases in a first interval, and
the second potential difference decreases in the first interval.

Configuration 9

The solar cell system according to any one of Configurations 1 to 6, wherein
a change in a first interval of the first absolute value is larger than a change in the first interval of the second absolute value, or
the second absolute value substantially does not change in the first interval.

Configuration 10

The solar cell system according to any one of Configurations 1 to 6, wherein the voltage converter modifies the absolute value of the third potential difference according to the temporal change of the first absolute value.

Configuration 11

The solar cell system according to any one of Configurations 1 to 6, wherein the voltage converter modifies a fourth potential difference between the fifth terminal and the sixth terminal according to the temporal change of the first absolute value.

Configuration 12

The solar cell system according to any one of Configurations 1 to 11, wherein
the voltage converter further includes a seventh terminal,
a signal corresponding to the first potential difference is input to the seventh terminal, and
a potential of the sixth terminal changes according to the signal.

Configuration 13

The solar cell system according to any one of Configurations 1 to 12, wherein
the voltage converter further includes a power supply terminal, and
electrical power is supplied from the first solar cell to the power supply terminal.

Configuration 14

The solar cell system according to any one of Configurations 1 to 13, wherein
the first solar cell has a first surface,
the first solar cell spreads along the first surface, and
at least a portion of the second solar cell overlaps at least a portion of the first solar cell in a first direction crossing the first surface.

Configuration 15

The solar cell system according to any one of Configurations 1 to 14, wherein
the first solar cell includes a chalcopyrite material, and
the second solar cell includes silicon.

Configuration 16

The solar cell system according to any one of Configurations 1 to 15, wherein
the first solar cell includes multiple first solar cell elements connected in series,
the first terminal is connected to one of the multiple first solar cell elements, and
the second terminal is connected to another one of the multiple first solar cell elements.

Configuration 17

The solar cell system according to any one of Configurations 1 to 16, wherein
the second solar cell includes multiple second solar cell elements connected in series,
the third terminal is connected to one of the multiple second solar cell elements, and
the fourth terminal is connected to another one of the multiple second solar cell elements.

Configuration 18

The solar cell system according to any one of Configurations 1 to 17, wherein the voltage converter includes a DC-DC converter.

Configuration 19

A method for controlling a solar cell system, the solar cell system including a first generator and a second generator, the first generator including a first solar cell, the second generator including a second solar cell and being connected in parallel with the first generator, the method comprising:
converting a second solar cell voltage of the second solar cell to reduce a difference between a first output voltage of the first generator and a second output voltage of the second generator.

Configuration 20

The method for controlling the solar cell system according to Configuration 19, wherein
a first solar cell voltage of the first solar cell increases in the first interval, and
the second solar cell voltage decreases in the first interval.

Configuration 21

The method for controlling the solar cell system according to Configuration 19, wherein
the absolute value of a change in the first interval of the first output voltage is larger than a change in the first interval of the absolute value of a difference between the first output voltage and the second output voltage, or the absolute value of the difference between the first output voltage and the second output voltage substantially does not change in the first interval.

Configuration 22

The method for controlling the solar cell system according to Configuration 19, wherein a conversion rate of the second solar cell voltage is changed according to a temporal change of the absolute value of the difference between the first output voltage and the second output voltage.

According to the embodiments, a solar cell system and a method for controlling a solar cell system can be provided in which stable electrical power can be obtained.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor or the like) is inserted between multiple conductive bodies so that a state is formable in which a current flows between the multiple conductive bodies.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in solar cell systems such as solar cells, voltage converters, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all solar cell systems, and methods for controlling solar cell systems practicable by an appropriate design modification by one skilled in the art based on the solar cell systems, and the methods for controlling solar cell systems described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A solar cell system, comprising:
a first solar cell including a first terminal and a second terminal;
a second solar cell including a third terminal and a fourth terminal, the third terminal being electrically connected to the first terminal; and
a voltage converter including a fifth terminal and a sixth terminal, the fifth terminal being electrically connected to the fourth terminal,
the voltage converter being configured to cause a second absolute value to be smaller than a first absolute value, the first absolute value being determined based on a difference between a first potential difference and a second potential difference, the first potential difference being between the first terminal and the second terminal, the second potential difference being between the first terminal and the fourth terminal, the second absolute value being determined based on a difference between the first potential difference and a third potential difference, the third potential difference being between the first terminal and the sixth terminal,
wherein the first absolute value changes temporally.

2. The system according to claim 1, further comprising an interconnect electrically connecting the sixth terminal and the second terminal.

3. The system according to claim 1, wherein
the first solar cell includes a first photoelectric conversion layer,
the first terminal is electrically connected to a portion of the first photoelectric conversion layer,
the second terminal is electrically connected to another portion of the first photoelectric conversion layer,
the second solar cell includes a second photoelectric conversion layer,
the third terminal is electrically connected to a portion of the second photoelectric conversion layer, and
the fourth terminal is electrically connected to another portion of the second photoelectric conversion layer.

4. The system according to claim 3, wherein
the portion of the first photoelectric conversion layer is of a first conductivity type,
the other portion of the first photoelectric conversion layer is of a second conductivity type,
the portion of the second photoelectric conversion layer is of the first conductivity type, and
the other portion of the second photoelectric conversion layer is of the second conductivity type.

5. The system according to claim 3, wherein a first bandgap of the first photoelectric conversion layer is different from a second bandgap of the second photoelectric conversion layer.

6. The system according to claim 5, wherein the first bandgap is larger than the second bandgap.

7. The system according to claim 1, wherein
the first potential difference increases in a first interval, and
the second potential difference decreases in the first interval.

8. The system according to claim 1, wherein
a change in a first interval of the first absolute value is larger than a change in the first interval of the second absolute value, or
the second absolute value substantially does not change in the first interval.

9. The system according to claim 1, wherein the voltage converter modifies an absolute value of the third potential difference according to a temporal change of the first absolute value.

10. The system according to claim 1, wherein the voltage converter modifies a fourth potential difference between the fifth terminal and the sixth terminal according to a temporal change of the first absolute value.

11. The system according to claim 1, wherein
the voltage converter further includes a seventh terminal,
a signal corresponding to the first potential difference is input to the seventh terminal, and
a potential of the sixth terminal changes according to the signal.

12. The system according to claim 1, wherein
the voltage converter further includes a power supply terminal, and
electrical power is supplied from the first solar cell to the power supply terminal.

13. The system according to claim 1, wherein
the first solar cell has a first surface,
the first solar cell spreads along the first surface, and
at least a portion of the second solar cell overlaps at least a portion of the first solar cell in a first direction crossing the first surface.

14. The system according to claim 1, wherein
the first solar cell includes a chalcopyrite material, and
the second solar cell includes silicon.

15. The system according to claim 1, wherein
the first solar cell includes a plurality of first solar cell elements connected in series,
the first terminal is connected to one of the plurality of first solar cell elements, and
the second terminal is connected to another one of the plurality of first solar cell elements.

16. The system according to claim 1, wherein the second solar cell includes a plurality of second solar cell elements connected in series,
the third terminal is connected to one of the plurality of second solar cell elements, and
the fourth terminal is connected to another one of the plurality of second solar cell elements.

17. The system according to claim 1, wherein the voltage converter includes a DC-DC converter.

18. A method for controlling a solar cell system, the solar cell system including a first generator and a second generator, the first generator including a first solar cell, the second generator including a second solar cell connected in parallel with the first generator, the method comprising:
converting a second solar cell voltage of the second solar cell to reduce a difference between a first output voltage of the first generator and a second output voltage of the second generator, wherein
a first solar cell voltage of the first solar cell increases in a first interval, and
the second solar cell voltage decreases in the first interval.

19. A solar cell system, comprising:
a first solar cell including a first terminal and a second terminal;
a second solar cell including a third terminal and a fourth terminal, the third terminal being electrically connected to the first terminal;
a voltage converter including a fifth terminal and a sixth terminal, the fifth terminal being electrically connected to the fourth terminal, and
an interconnect electrically connecting the sixth terminal and the second terminal,
the voltage converter being configured to cause a second absolute value to be smaller than a first absolute value, the first absolute value being determined based on a difference between a first potential difference and a second potential difference, the first potential difference being between the first terminal and the second terminal, the second potential difference being between the first terminal and the fourth terminal, the second absolute value being determined based on a difference between the first potential difference and a third potential difference, the third potential difference being between the first terminal and the sixth terminal.

* * * * *